United States Patent
Lee et al.

(10) Patent No.: US 9,015,545 B2
(45) Date of Patent: Apr. 21, 2015

(54) SOLID STATE DRIVE TESTER

(71) Applicant: Unitest Inc, Yongin-si, Gyeonggi-do (KR)

(72) Inventors: Eui Won Lee, Seongnam-si (KR); Hyo Jin Oh, Yongin-si (KR)

(73) Assignee: Unitest Inc, Yongin-si, Gyeonggi-do (KR)

( * ) Notice: Subject to any disclaimer, the term of this patent is extended or adjusted under 35 U.S.C. 154(b) by 145 days.

(21) Appl. No.: 13/921,753

(22) Filed: Jun. 19, 2013

(65) Prior Publication Data

US 2014/0047287 A1 Feb. 13, 2014

(30) Foreign Application Priority Data

Aug. 13, 2012 (KR) .......................... 10-2012-0088334

(51) Int. Cl.
| | |
|---|---|
| *G01R 31/28* | (2006.01) |
| *G11C 29/10* | (2006.01) |
| *G06F 11/22* | (2006.01) |
| *G06F 13/38* | (2006.01) |
| *G06F 13/40* | (2006.01) |
| *G11C 29/56* | (2006.01) |
| *G11C 29/04* | (2006.01) |

(52) U.S. Cl.
CPC ............ *G11C 29/10* (2013.01); *G06F 11/2221* (2013.01); *G06F 13/385* (2013.01); *G06F 13/4022* (2013.01); *G06F 2213/0026* (2013.01); *G06F 2213/0028* (2013.01); *G06F 2213/0032* (2013.01); *G11C 29/56008* (2013.01); *G11C 2029/0401* (2013.01)

(58) Field of Classification Search
CPC ................. G11C 29/56004; G11C 2029/5602; G11C 2029/5606
USPC ................................... 714/738, 739
See application file for complete search history.

(56) References Cited

U.S. PATENT DOCUMENTS

| | | | | |
|---|---|---|---|---|
| 7,640,132 | B2 * | 12/2009 | Katagiri et al. | ............... 702/123 |
| 2004/0090616 | A1 * | 5/2004 | French et al. | ................ 356/73.1 |
| 2005/0261855 | A1 * | 11/2005 | Adachi et al. | ................ 702/108 |
| 2006/0182311 | A1 * | 8/2006 | Lev | .............................. 382/103 |
| 2009/0100050 | A1 * | 4/2009 | Erol et al. | ........................ 707/5 |
| 2010/0102840 | A1 * | 4/2010 | Ueda et al. | .................... 324/755 |
| 2013/0138383 | A1 * | 5/2013 | Filler et al. | .................... 702/123 |

FOREIGN PATENT DOCUMENTS

| | | |
|---|---|---|
| KR | 10-2008-0039605 A | 5/2008 |
| KR | 10-2010-0114697 A | 10/2010 |

* cited by examiner

*Primary Examiner* — M. Mujtaba K Chaudry
(74) *Attorney, Agent, or Firm* — Novick, Kim & Lee, PLLC; Jae Youn Kim (57) ABSTRACT

Disclosed is a solid state drive tester which divides the functions of generating and comparing test pattern data and Frame Information Structure (FIS) data with each other into each other to implement the functions as separate logics, so that entire test time is decreased by reducing load of a processor. The solid state drive tester includes a host terminal for receiving a test condition for testing a storage from a user, and a test control unit creating a test pattern corresponding to the test condition, and adaptively selecting an interface according to an interface type of the storage to be tested to test the storage using the test pattern, wherein the test control unit is divided into a control module for controlling the test of the storage and a test execution module for practically executing the test in hardware to test a plurality of storages in real time.

8 Claims, 6 Drawing Sheets

SOLID STATE DRIVE TESTER

BACKGROUND OF THE INVENTION

1. Field of the Invention

The present invention relates to a solid state drive (SSD) tester, and more particularly to an SSD tester which divides the functions of generating and comparing test pattern data and Frame Information Structure (FIS) data with each other into each other to implement the functions as separate logics, so that entire test time is decreased by reducing load of a processor.

2. Description of the Related Art

Until now, hard disk drives (HDDs) have been most generally known and used as large capacity digital media storage devices. However, in recent years, as prices of NAND flash semiconductor devices, which can store the largest capacity among semiconductor devices having a memory function and data stored therein are not erased even when electric power is not supplied, are being lowered, large capacity digital medial storage apparatus such as solid state drives (SSDs) using a semiconductor having a memory function are newly appearing.

Writing and reading speeds of such an SSD are 3 to 5 times as fast as those of existing hard disks, and its performance of reading/writing a random address required by a database management system is several hundreds of times as excellent as those of existing hard disks. In addition, an SSD is operated in a silent way, so a noise problem of an existing hard disk can be solved. Further, since the SSD is operated with power consumption significantly lower than that of a hard disk, the SSD is known as to most suitable for a digital device, such as a laptop computer, which requires low power consumption.

In addition, the SSD has a higher durability against an external impact than an existing hard disk, and as the SSD can be manufactured to be smaller and more various in shape as compared with a hard disk having a fixed form in terms of an external design, an external shape of an electronic product employing the SSD can be made smaller, showing many excellent advantages in its applications.

Due to its advantages, it is expected that distributions of SSDs can be expanded rapidly to searches, home shopping, storage media of video service servers, storage media for storing various R&D materials, and special equipment, as well as existing desktop computers or laptop computers.

Figure 1:
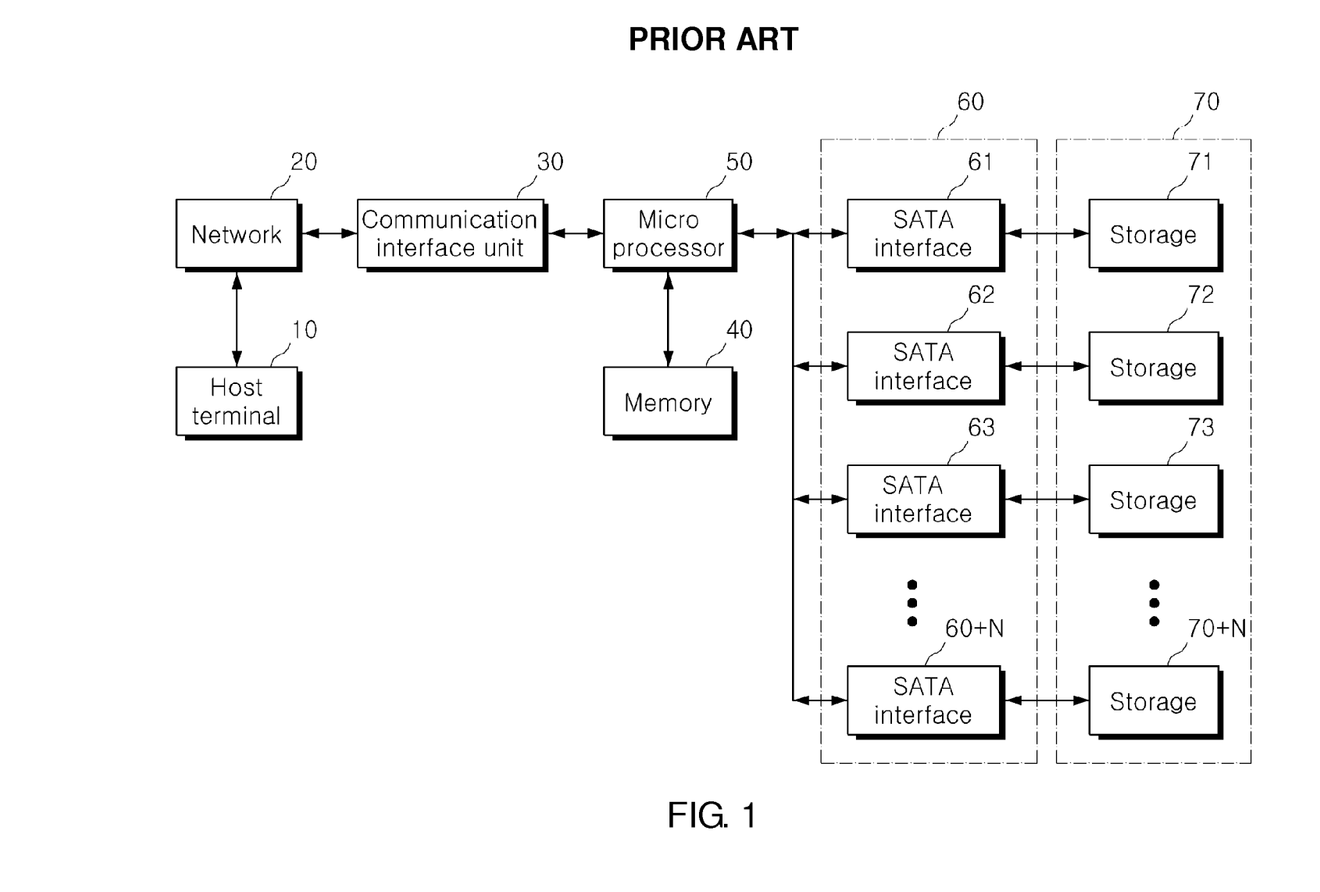
FIG. 1 is a schematic block diagram of a solid state drive test device according to the related art.

As a scheme of testing the above-described SSD, an SSD tester according to the related art is illustrated in FIG. 1.

The SSD tester according to the related art shown in FIG. 1 includes a host terminal 10, a network 20, a communication interface unit 30, a memory 40, a micro processor 50, a storage interface unit 60, and a storage unit 70. The storage interface unit 60 includes a plurality of storage interfaces 61~60+n. The storage unit 70 includes a plurality of storages 71~70+N, and respective storage interfaces perform the same function. Each unit in the above described SSD tester according to the related art is provided as a separate device.

The network 20 maintains a wired/wireless network connection with the host terminal 10. The network 20 may be network-connected to the host terminal 10 through wired communication such as LAN, USB, or RS-232, and wireless local area communication such as Bluetooth, Zigbee, or UWB.

A user inputs a test condition through the host terminal 10. The input test condition, which is received through the network 20, is transferred to the micro processor 50 through the communication interface unit 30 of a next stage.

The micro processor 50 generates a test pattern for testing the storage 70 in connection with the memory 40 according to the transferred test condition. The test pattern may be implemented as various types of test patterns which are widely used for testing an SSD and various types of storages. In addition, the micro processor 50 performs a function of generating Frame Information Structure (FIS) data.

The micro processor 50 controls test of the storage 70 using the generated test pattern. For example, the micro processor 50 generates a test signal based on the test pattern and transmits the test signal to the storage 70 through the storage interface unit 60 so that test of the storage 70 may be controlled. The test control includes storing the test pattern generated for the test in the storage 70, reading out the test pattern from the storage 70, and comparing the stored test pattern (expectation data) with the read test pattern (readout data) to process a fail.

As well known in the related art, the micro processor 50 performs all functions related to the test, such as a function of generating the test pattern for testing the SSD, a function of generating the FIS data, a function of storing the test pattern in the storage 70, a function of reading out data from the storage 70, a function of comparing the stored data with the read data to determine whether a fail occurs.

The storage interface unit 60 maintains interface with the storage 70. The storage interface unit 60 performs Serial-ATA (SATA) interface with the storage 70.

However, in the related art as illustrated above, since the micro processor 50 completely performs all functions related to the SSD test, such as a function of generating the test pattern for testing the SSD, a function of generating the FIS data, a function of storing the test pattern in the storage 70, a function of reading out data from the storage 70, a function of comparing the stored data with the read data to determine whether a fail occurs, load of the micro processor is weighted so that a real-time test is impossible.

Specifically, as described above, since one micro processor completely performs entire functions for the SSD test, the real-time test is impossible, so since when plural SSDs are tested, the SSDs must be sequentially tested, the micro processor requires much time to test all SSDs.

SUMMARY OF THE INVENTION

Accordingly, the present invention has been made keeping in mind the above problems occurring in the prior art, and an object of the present invention is to provide an SSD tester which divides the functions of generating and comparing test pattern data and Frame Information Structure (FIS) data with each other into each other to implement the functions as separate logics, so that entire test time is decreased by reducing load of a processor.

It is another object of the present invention to provide an SSD tester capable of randomly generating various pattern data.

According to an aspect of the present invention, there is provided a solid state drive tester which includes: a host terminal for receiving a test condition for testing a storage from a user; and a test control unit generating a test pattern corresponding to the test condition, and adaptively selecting an interface according to an interface type of the storage to be tested to test the storage using the test pattern, wherein the test control unit is divided into a control module for controlling the test of the storage and a test execution module for practically executing the test in hardware to test a plurality of storages in real time.

The test control unit includes: an embedded processor for controlling the test of the storage; and a test executing unit for generating a test pattern to test the storage, transmitting the test pattern to the storage, and determining whether a fail occurs by comparing the test pattern with a test pattern read out from the storage in cooperation with the embedded processor.

The test control unit includes: a communication interface unit connected with the host terminal through a network to receive information of the user and to transmit a test result to the host terminal; and a storage interface unit for interfacing the storage.

The test executing unit includes: a pattern data generator for generating pattern data by selecting one of pattern data generated corresponding to the test condition and random pattern data according to a pattern selection signal generated from the embedded processor; a fail processor for comparing the pattern data generated from the pattern data generator with test result data read out from the storage to determine whether the fail occurs and to generate fail information when the fail occurs; a fail memory for storing the fail information generated from the fail processor; and an instruction generator for transmitting a test instruction generated from the embedded processor to the storage interface unit.

The pattern data generator includes: a pattern data memory for storing the pattern data generated according to the test condition; a pattern data creating unit for randomly generating the pattern data to output the pattern data as the random pattern data; and a multiplexer for outputting the pattern data by selecting one of the pattern data output from the pattern data memory and the pattern data output from the pattern data creating unit according to the pattern data selection signal output from the embedded processor.

The pattern data creating unit includes a plurality of pattern data generators for randomly generating the pattern data.

The fail processor includes: a comparing unit for comparing writing data generated from the pattern data generator with reading data read out from the storage to generate a fail signal when the writing data are not equal to the reading data; a fail counter for counting a number of the fail signals generated from the comparing unit to output a fail count value; and a fail memory address generator for generating a storage address to store the fail signal when the fail signal is generated from the comparing unit.

The storage interface unit includes a plurality of multi-interfaces to simultaneously test a plurality of the storages, and the multi-interfaces comprise a plurality of interfaces corresponding to the interfaces of the storage, and interface with the storage by selecting one of the interfaces according to the interface selection signal generated from the embedded processor corresponding to the storage interface.

According to the present invention, the functions of generating and comparing test pattern data and Frame Information Structure (FIS) data with each other, which are performed by an embedded processor, are divided into each other to implement the functions as separate logics, so that entire test time is decreased by reducing load of a processor.

According to the present invention, since various pattern data can be randomly generated, a user can freely use desired pattern data.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION OF THE INVENTION

Hereinafter, an exemplary embodiment of the present invention will be described in detail with reference to the accompanying drawings. A detailed description of known functions and configurations of the present invention will be omitted when it may make the subject of the present invention unclear.

Figure 2:
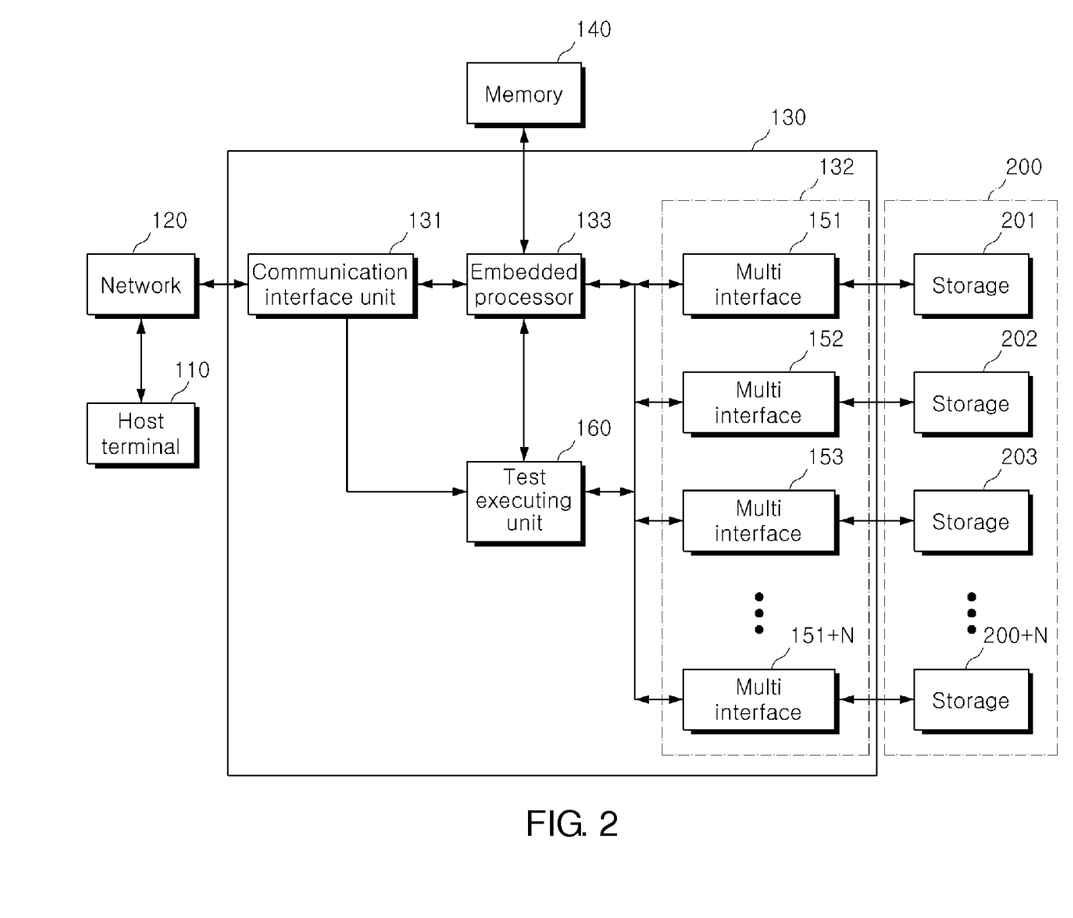
FIG. 2 is a block diagram illustrating a configuration of an SSD tester according to an embodiment of the present invention.

FIG. 2 is a block diagram illustrating a configuration of an SSD tester according to an embodiment of the present invention. The SSD tester includes a host terminal 110, a network 120, a test control unit 130, and a memory 140. In FIG. 2, reference numeral 200 denotes a storage unit 200 including a plurality of storages 201 to 200+N which are test targets.

The host terminal 110 functions to receive a test condition for testing a storage from the user, and the network 120 is in charge of a data interface between the host terminal 110 and the test control unit 130.

A program for testing an SSD is stored in the memory 140, and performs the function of a data memory device for storing pattern data for generating a test pattern and data generated in an SSD test.

The test control unit 130 functions to generate a test pattern according to the test condition or to randomly generate a test pattern, and adaptively selects an interface according to a storage type of the storage to be tested to test the storage with the test pattern. Preferably, a plurality of devices installed in the test control unit 130 to test the SSD is implemented as one chip by using a field programmable gate array (FPGA).

Preferably, the test control unit 130 is divided into a control module for controlling the test of the storage and a test execution module for practically executing the test in hardware to test a plurality of storages in real time.

Figure 3:
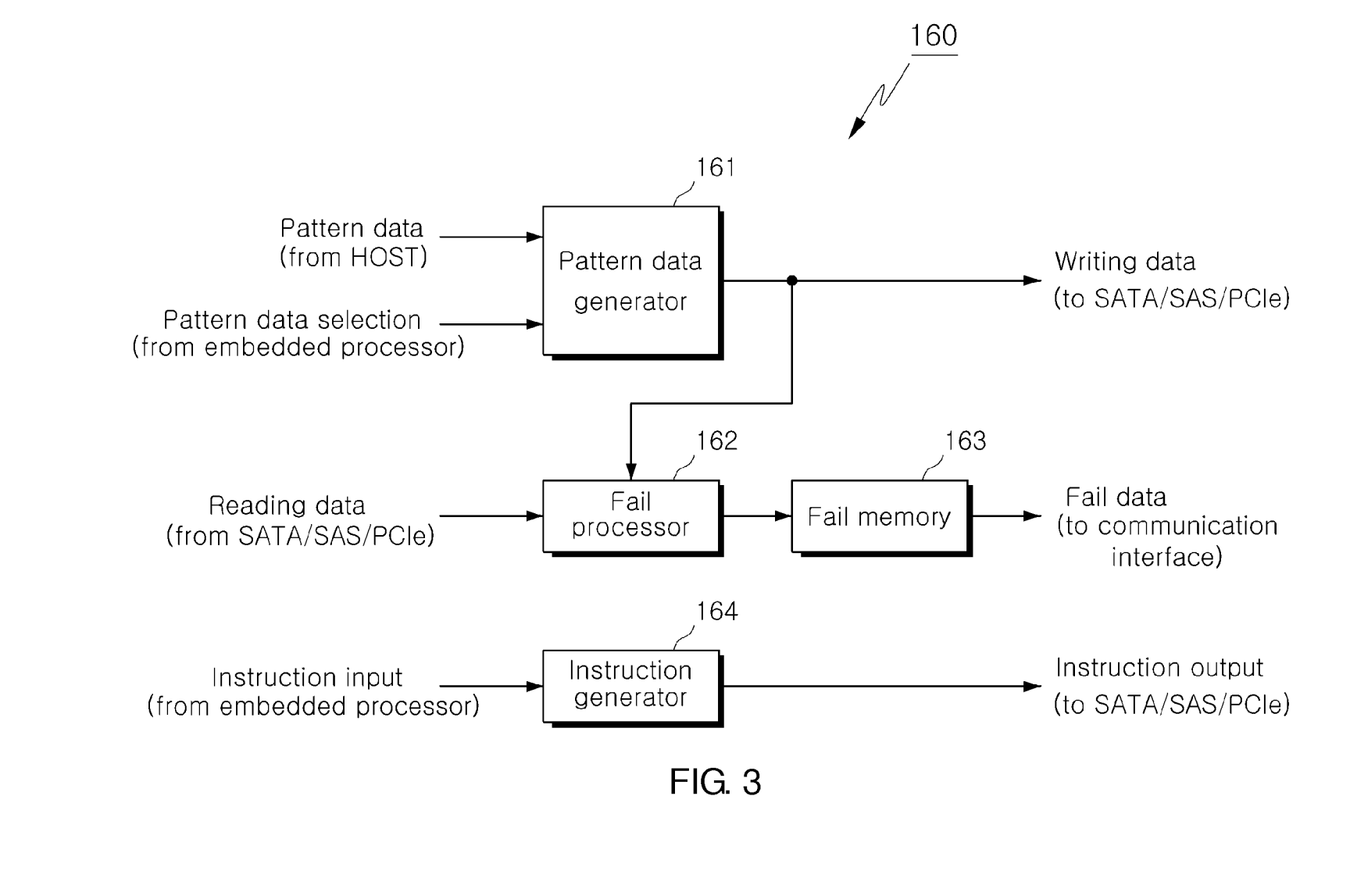
FIG. 3 is a block diagram illustrating an example of a test executing unit shown in FIG. 2.

The test control unit 130 according to the related art includes a communication interface unit 131 connected to the host terminal 110 through the network 120 to receive information of the user and to transmit the test result to the host terminal 110, a storage interface unit 132 for interfacing the storage unit 200, an embedded processor 133 for controlling the storage test, and a test executing unit 160 in cooperation with the embedded processor 133 for generating a test pattern for testing the storage and transmitting the test pattern to the storage, and for comparing the generated test pattern with a test pattern stored in the storage to process whether a fail occurs. Further, as shown in FIG. 3, the test executing unit 160 includes a pattern data generator 161 for selecting one of pattern data generated corresponding to the test condition according to a pattern selection signal generated from the embedded processor 133 and random pattern data to generate pattern data, a fail processor 162 for comparing the pattern data generated from the pattern data generator 161 with test result data read out from the storage to determining whether the fail occurs, such that fail information is generated when the fail occurs, a fail memory 163 for storing the fail information generated from the fail processor 162, and an instruction generator 164 for transmitting a test instruction generated from the embedded processor to the storage interface unit 132.

Figure 4:
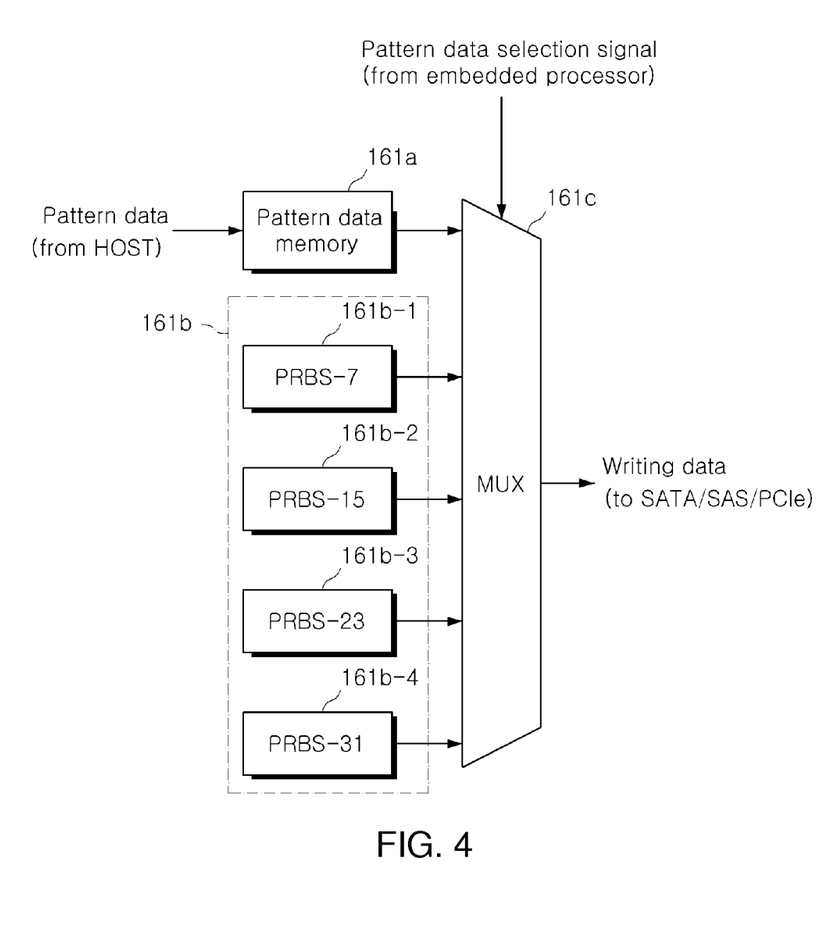
FIG. 4 is a block diagram illustrating an example of a pattern data generator shown in FIG. 3.

In addition, as shown in FIG. 4, the pattern data generator 161 includes a pattern data memory 161a for storing the pattern data generated according to the test condition, a pattern data creating unit 161b for randomly generating pattern data to output the pattern data as random pattern data, and a multiplexer 161c for selecting one of the pattern data output from the pattern data memory 161a according to a pattern data selection signal output from the embedded processor 133 and the pattern data output from the pattern data creating unit 161b to output the selected data as the pattern data.

Figure 6:
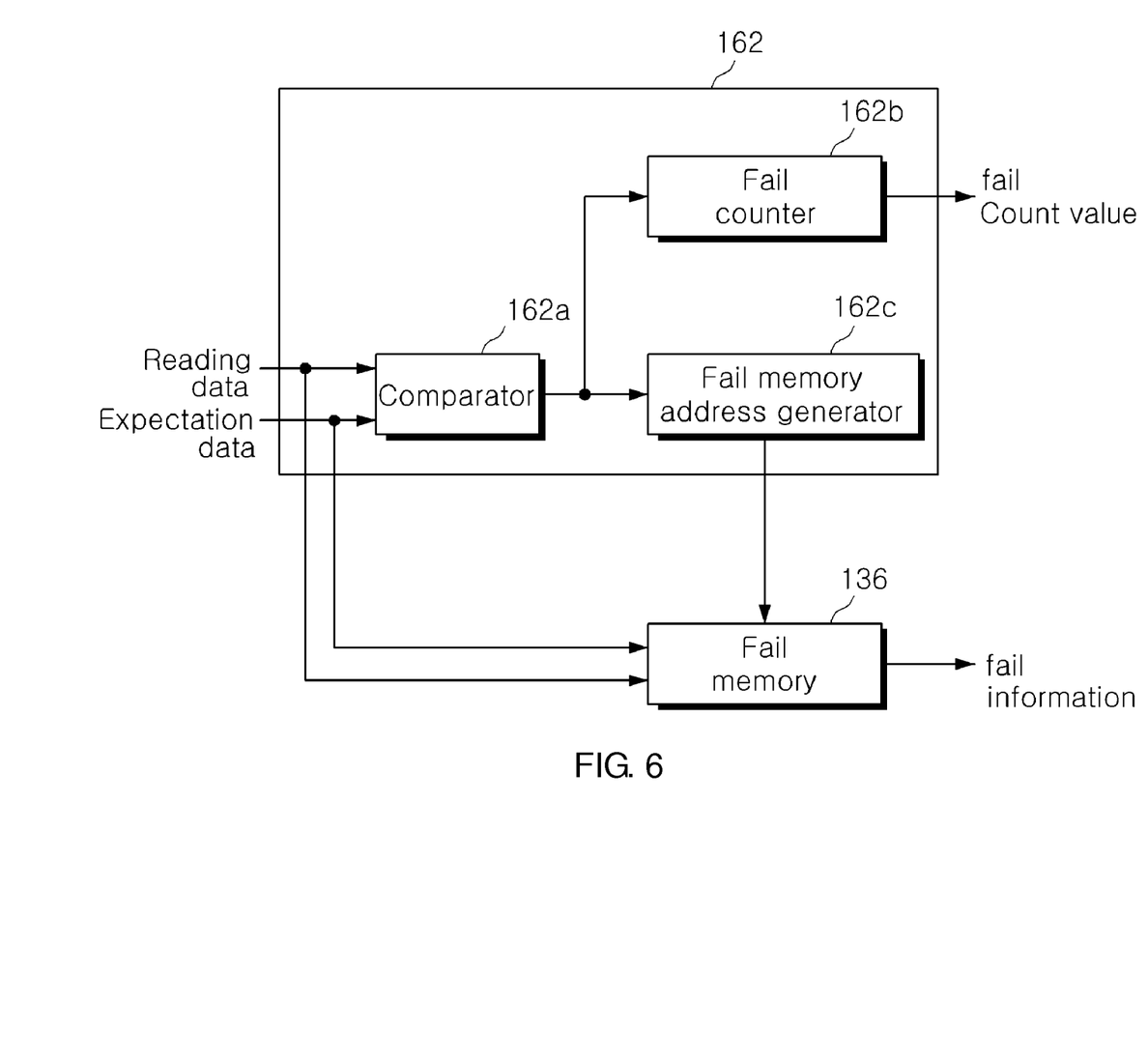
FIG. 6 is a block diagram illustrating an example of a fail processor shown in FIG. 3.

Further, as shown in FIG. 6, the fail processor 162 includes a comparing unit 162a for comparing writing data generated from the pattern data generator 161 with reading data read out from the storage to generate a fail signal when the writing data is not equal to the reading data, a fail counter 162b for counting a number of the fail signal generated from the comparing unit 162a to output a fail count value, and a fail memory address generator 162c for generating a storage address to store the fail signal when the fail signal is generated from the comparing unit 162a.

Meanwhile, the storage interface unit 132 includes a plurality of multi-interfaces 151 to 151+N. Here, internal configurations and operations of the plurality of multi-interfaces 151 to 151+N are the same, and thus only one multi-interface 151 will be described below for convenience' sake.

Figure 5:
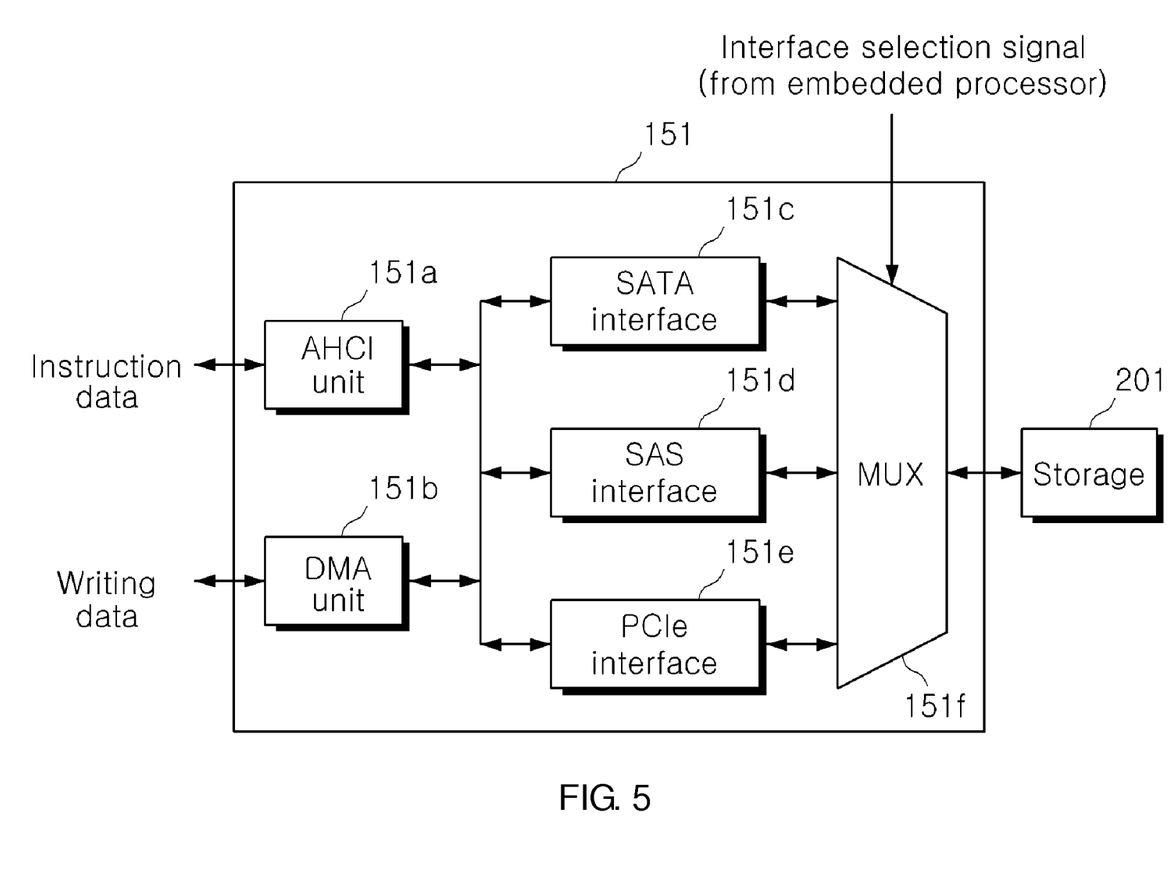
FIG. 5 is a block diagram illustrating an example of a storage interface unit shown in FIG. 2.

As illustrated in FIG. 5, the multi-interface 151 includes an advanced host controller interface (AHCI) 151a for interfacing instruction data generated in the embedded processor 133, a direct memory access (DMA) unit 151b for interfacing writing data generated in the embedded processor 133, a serial-ATA (SATA) interface 151c for supporting an SATA interface between the advanced host controller interface 151a and the storage 201 and between the direct memory access unit 151b and the storage 201, a serial attached SCSI (SAS) interface 151d for supporting an SAS interface between the advanced host controller interface 151a and the storage 201 and between the direct memory access unit 151b and the storage 201, a PCI express (PCIe) interface 151e for supporting a PCIe interface between the advanced host controller interface 151a and the storage 201 and between the direct memory access unit 151b and the storage 201, and a multiplexer (MUX) 151f for selecting one of the SATA interface 151c, the SAS interface 151d, and the PCIe interface 151e according to an interface selection signal generated in the embedded processor 133 to connect the storage 201 and the embedded processor 133.

In the above-described SSD tester according to the present invention, a plurality of test devices for testing a storage are implemented as one chip on one board by using FPGA. In this state, after a user who wants to test an SSD allows the solid state drive tester to access a test target storage, the user inputs a test condition through the host terminal 110. Here, the test condition may include an interface selection signal for interfacing the test target storage and a test pattern selection signal. The test pattern selection signal is a signal for determining whether predetermined pattern data are selected or a plurality of random patter data arbitrarily generated are selected.

The test condition of the user input through the host terminal 110 is transferred to the one-chipped test control unit 130 through the network 120.

The communication interface unit 131 of the test control unit 130 receives the test condition input by the user through the network 120, and transfers the received test condition to the embedded processor 133. If the test condition is input by the user and a test is requested, the embedded processor 133 extracts a test program for the storage test from the memory 140 and starts to test the storage. Here, as an initial operation of the test, test pattern data corresponding to the test condition input by the user are extracted from the memory 140 and are transferred to the test executing unit 160.

The test executing unit 160 is a separate logic for a module for executing a practical test separated from the embedded processor 133. Thus, by separating the module (generating a test pattern data and confirming a fail) for executing the test from the embedded processor 133, the burden of the embedded processor 133 may be reduced and the control and test for plural storages are performed at the same time, so that entire test time can be reduced.

In more detail, as shown in FIG. 3, the pattern data generator 161 of the test executing unit 160 selects one of pattern data generated corresponding to the test condition according to the pattern data selection signal output from the embedded processor 133 and random pattern data to generate the pattern data.

For example, as shown in FIG. 4, in the pattern data generator 161, the pattern data generated corresponding to the test condition are stored in the pattern data memory 161a and are output to the multiplexer 161c. The pattern data creating unit 161b randomly generates the pattern data (Psuedo Random Binary Sequence: PRBS) to transfer the pattern data to the multiplexer 161c.

Preferably, the pattern data creating unit 161b includes a plurality of pattern data creators 161b-1 to 161b-4.

For example, the pattern data creator 161b-1 generates 8-bit pattern data, the pattern data creator 161b-2 generates 16-bit pattern data, the pattern data creator 161b-3 generates 24-bit pattern data, and the pattern data creator 161b-4 generates 32-bit pattern data.

The multiplexer 161c selects one of the pattern data stored in the pattern data memory 161a and the pattern data randomly generated from the pattern data creating unit 161b according to the pattern data selection signal generated from the embedded processor 133 to transfer the selected data to the multi-interface 151 of the storage interface unit 132. When plural storages are tested at the same time, the pattern data are applied to the plurality of multi-interfaces at the same time.

At this time, as illustrated in FIG. 5, an interface selection signal is provided to the multi-interface 151 to select an interface corresponding to the storage 201.

For example, an interface selection signal is applied from the embedded processor 133 to the multiplexer 151f of the multi-interface 151, the multiplexer 151f selects one of the interfaces SATA, SAS, and PCIe according to the applied interface selection signal. That is, an interface corresponding to the interface of the storage 201 is selected.

Thereafter, instruction data output from the embedded processor 133 for the test are input to the SATA interface 151c, the SAS interface 151d, and the PCIe interface 151e through the advanced host controller interface 151a, respectively.

In addition, writing data output from the test executing unit 160 are input to the SATA interface 151c, the SAS interface 151d, and the PCIe interface 151e, respectively, through the DMA unit 151b.

When the instruction data output from the embedded processor 133 and the writing data output from the test executing unit 160 are input to the respective interfaces in this way, the multiplexer 151f selects only one interface according to an interface selection signal. The test of the storage 201 is started by transferring the instruction data and writing data input to the selected interface to the storage 201. For example, when the interface of the storage 201 uses the SATA interface, the SATA interface 151c is selected, and the instruction data and writing data input to the SATA interface 151c are converted into a format suitable for the SATA interface to be applied to the storage 201.

Here, since standard interfaces are employed for the SATA interface, the SAS interface, and the PCIe interface, and protocols for interfaces, a detailed description of respective interfaces is omitted.

Next, after result data for testing the storage 201 are read out according to a reading instruction, they are transferred to the embedded processor 133 through the multiplexer 151f, the SATA interface 151c, and the DMA unit 151b of the multi-interface 151.

If the data obtained by reading out the storage test are transferred to the embedded processor 133, the embedded processor 133 transmits the readout data to the test executing unit 160.

As shown in FIG. 6, a comparator 162a of the fail processor 162 compares expectation data output from the pattern data generator 161 with the readout data (reading data) transferred from the embedded processor 133, and does not generate a fail signal if they are the same and to the contrary, generates the fail signal if they are different.

According to the generated fail signal, the fail counter 162b increases an internal count value by 1 to output a fail count value, and a fail memory address generator 162c generates and transfers an address of a fail memory to the fail memory 163.

The fail memory 163 stores expectation data and reading data inputted to the fail processor 162 as fail information by using the transferred address as a logical block address (LBA).

As described above, in another characteristic of the present invention, since the embedded processor 133 does not perform fail processing during testing a storage but a test executing unit 160 as a logic separated from the embedded processor 133 performs fail processing, burden of the embedded processor 133 can be reduced and accordingly an entire storage test time can be reduced by simultaneously testing the storages.

Further, the fail information stored in the fail memory 163 is transferred to the embedded processor 133 upon the request of the embedded processor 133, and is transmitted to the host terminal 110 through the communication interface unit 131 and the network 120.

Thus, the user can easily recognize the test result of the storage tested through the host terminal 110.

As described above, the present invention separates the SSD test function performed in the embedded processor as a separate logic, so that burden of the embedded processor 133 can be reduced and accordingly an entire storage test time can be reduced.

The present invention designs interface of a storage using an FPGA which allows a user to easily use the interface if needed. Various interfaces are implemented by one chip using an FPGA which allows the user to selectively use interface corresponding to the interface of the storage without changing H/W.

The present invention is not limited to the above-described embodiment, and may be variously modified by those skilled in the art to which the present invention pertains without departing from the spirit of the present invention and the modification falls within the scope of the present invention.

What is claimed is:

1. A solid state drive tester comprising:
    a host terminal for receiving a test condition for testing a storage from a user; and
    a test control unit generating a test pattern corresponding to the test condition, and adaptively selecting an interface according to an interface type of the storage to be tested to test the storage using the test pattern,
    wherein the test control unit is divided into a control module for controlling the test of the storage and a test execution module for practically executing the test in hardware to test a plurality of storages in real time.

2. The solid state drive tester of claim 1, wherein the test control unit comprises:
    an embedded processor for controlling the test of the storage; and
    a test executing unit for generating the test pattern to test the storage, transmitting the test pattern to the storage, and determining whether a fail occurs by comparing the generated test pattern with another test pattern read out from the storage in cooperation with the embedded processor.

3. The solid state drive tester of claim 2, wherein the test control unit comprises:
    a communication interface unit connected with the host terminal through a network to receive information of the user and to transmit a test result to the host terminal; and
    a storage interface unit for interfacing the storage.

4. The solid state drive tester of claim 2, wherein the test executing unit comprises:
    a pattern data generator for generating pattern data by selecting one of pattern data generated corresponding to the test condition and random pattern data according to a pattern selection signal generated from the embedded processor;
    a fail processor for comparing the pattern data generated from the pattern data generator with test result data read out from the storage to determine whether the fail occurs and to generate fail information when the fail occurs;
    a fail memory for storing the fail information generated from the fail processor; and
    an instruction generator for transmitting a test instruction generated from the embedded processor to the storage interface unit.

5. The solid state drive tester of claim 4, wherein the pattern data generator comprises:
    a pattern data memory for storing the pattern data generated according to the test condition;
    a pattern data creating unit for randomly generating the pattern data to output the pattern data as the random pattern data; and
    a multiplexer for outputting the pattern data by selecting one of the pattern data output from the pattern data memory and the random pattern data output from the pattern data creating unit according to the pattern data selection signal output from the embedded processor.

6. The solid state drive tester of claim 5, wherein the pattern data creating unit comprises a plurality of pattern data creators for randomly generating the pattern data.

7. The solid state drive tester of claim 4, wherein the fail processor comprises:
    a comparing unit for comparing writing data generated from the pattern data generator with reading data read out from the storage to generate a fail signal when the writing data are not equal to the reading data;

a fail counter for counting a number of fail signals generated from the comparing unit to output a fail count value; and
 a fail memory address generator for generating a storage address to store the fail signals when the fail signals are generated from the comparing unit.

8. The solid state drive tester of claim 3, wherein the storage interface unit comprises a plurality of multi-interfaces to simultaneously test the plurality of storages, and wherein at least one of the plurality of multi-interfaces comprises a plurality of interfaces corresponding to the interfaces of the storage, and interfaces with the storage by selecting one of the interfaces according to the interface selection signal generated from the embedded processor corresponding to the storage interface.

* * * * *